(12) United States Patent
Sohn et al.

(10) Patent No.: US 6,489,210 B1
(45) Date of Patent: Dec. 3, 2002

(54) METHOD FOR FORMING DUAL GATE IN DRAM EMBEDDED WITH A LOGIC CIRCUIT

(75) Inventors: Dong Kyun Sohn, Chungcheongbuk-do (KR); Jeong Mo Hwang, Taejeon-si (KR)

(73) Assignee: Hyundai Electronics Co., Ltd., Kyoungki-do (KR)

( * ) Notice: Subject to any disclaimer, the term of this patent is extended or adjusted under 35 U.S.C. 154(b) by 0 days.

(21) Appl. No.: 09/432,807

(22) Filed: Nov. 3, 1999

(30) Foreign Application Priority Data

Jan. 12, 1999 (KR) .................................................. 99-570

(51) Int. Cl.⁷ ............................................. H01L 21/336
(52) U.S. Cl. ........................ 438/306; 438/530; 438/587; 438/592
(58) Field of Search ................................. 438/283, 305, 438/306, 530, 542, 558, 587, 588, 592

(56) References Cited

U.S. PATENT DOCUMENTS

| | | | |
|---|---|---|---|
| 5,416,037 A | 5/1995 | Sato et al. .................. 438/254 |
| 5,770,494 A | * 6/1998 | Yamamoto et al. ......... 438/232 |
| 6,037,222 A | * 3/2000 | Huang et al. ................ 438/257 |
| 6,096,599 A | * 8/2000 | Kepler et al. ............... 438/249 |
| 6,255,181 B1 | * 7/2001 | Song et al. .................. 438/305 |

* cited by examiner

Primary Examiner—Stephen D. Meier
Assistant Examiner—Jamie L. Brophy
(74) Attorney, Agent, or Firm—Morgan, Lewis & Bockius LLP (57) ABSTRACT

A method for forming a dual gate of a semiconductor device includes the steps of sequentially stacking a gate insulating film, a semiconductor layer, and a low resistance metal layer on a semiconductor substrate having a first well of a first conductivity type and a second well of a second conductivity type, forming first and second gate patterns that include the semiconductor layer and the low resistance metal layer on the substrate corresponding to the first and second wells, forming sidewall spacers at sides of the first and second gate patterns, and exposing the first well and the first gate pattern, implanting impurity ions of the second conductivity type into the exposed first well and the first gate pattern to form a first source and a first drain, exposing the second well and the second gate pattern, implanting impurity ions of the first conductivity type into the exposed second well and the second gate pattern to form a second source and a second drain; and diffusing the impurity ions from the low resistance metal layer into the semiconductor layer to form first and second gate electrodes.

8 Claims, 6 Drawing Sheets

METHOD FOR FORMING DUAL GATE IN DRAM EMBEDDED WITH A LOGIC CIRCUIT

This application claims priority to Korean Patent Application No. 570/1999, filed on Jan. 12, 1999, which is hereby incorporated by reference.

BACKGROUND OF THE INVENTION

1. Field of the Invention

The present invention relates to a semiconductor device, and more particularly, to a method for forming a dual gate of a semiconductor device, which simplifies process steps and improves reliability of the semiconductor device.

2. Background of the Related Art

Generally, in fabrication of MOS devices, a single poly gate structure requires a buried PMOS transistor, which increases a short channel effect. In this case, it is difficult to fabricate a device having a gate length of 0.25 $\mu$m or less. A dual gate structure has been proposed, in which a P-poly gate is used in a PMOS transistor and an N-poly gate is used in an NMOS transistor. FIGS. 1A to 1F show cross-sectional views illustrating a related art method for forming a dual gate of a semiconductor device.

Figure 1A:
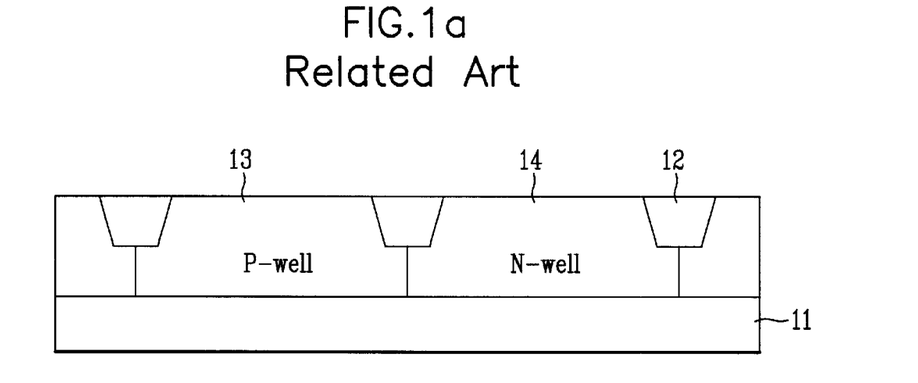
FIGS. 1A to 1F are cross-sectional views illustrating a related art method for forming a dual gate of a semiconductor device.

As shown in FIG. 1A, an isolation region 12 is partially formed in a semiconductor substrate 11 by a local oxidation of silicon (LOCOS) process or a trench isolation process. Thereafter, a P well region 13 and an N well region 14 are selectively formed in the semiconductor substrate 11 by impurity ion implantation.

The N well region 14 is masked during the formation of the P well region 13, while the P well region 13 is masked during formation of the N well region 14. (These steps are not illustrated in the figures).

Figure 1B:
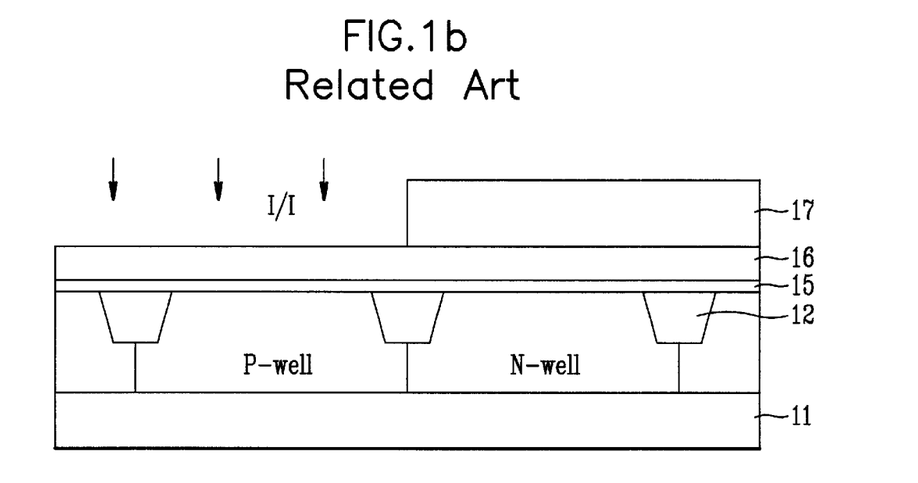

As shown in FIG. 1B, a gate insulating film 15 is formed on the semiconductor substrate 11. Subsequently, an undoped polysilicon layer 16 is deposited on the gate insulating film 15. A first photoresist 17 is then selectively deposited on the polysilicon layer 16. The first photoresist 17 is then patterned by exposure and developing processes to mask the polysilicon layer 16 of the N well region 14. N-type impurity ions are then implanted into the exposed polysilicon layer 16 of the P well region 13.

Figure 1C:
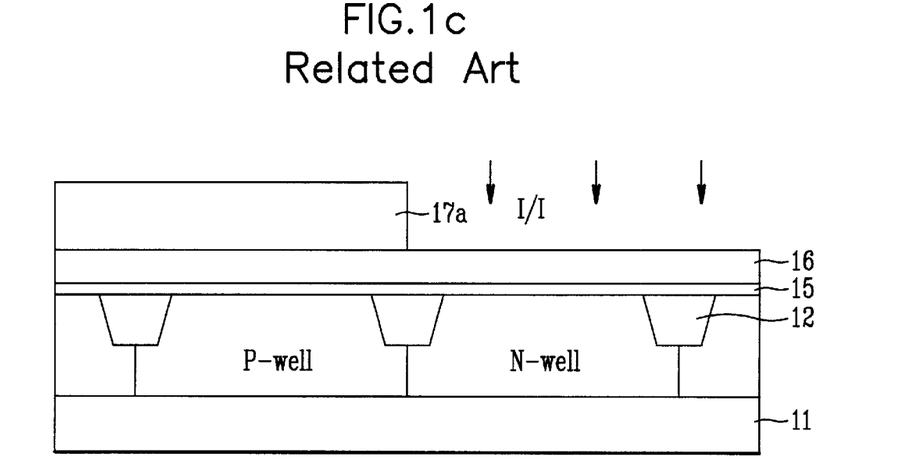

As shown in FIG. 1C, the first photoresist 17 is removed and then a second photoresist 17a is deposited on an entire surface of the semiconductor substrate including the polysilicon layer 16, into which the N-type impurity ions were implanted. The second photoresist 17a is patterned by an exposure and developing processes to mask the polysilicon layer 16 (into which the N-type impurity ions are implanted) of the P well region 13. P-type impurity ions are implanted into the exposed polysilicon layer 16. The P-type the impurity ion implantation may also be performed prior to the N-type impurity ion implantation.

Figure 1D:
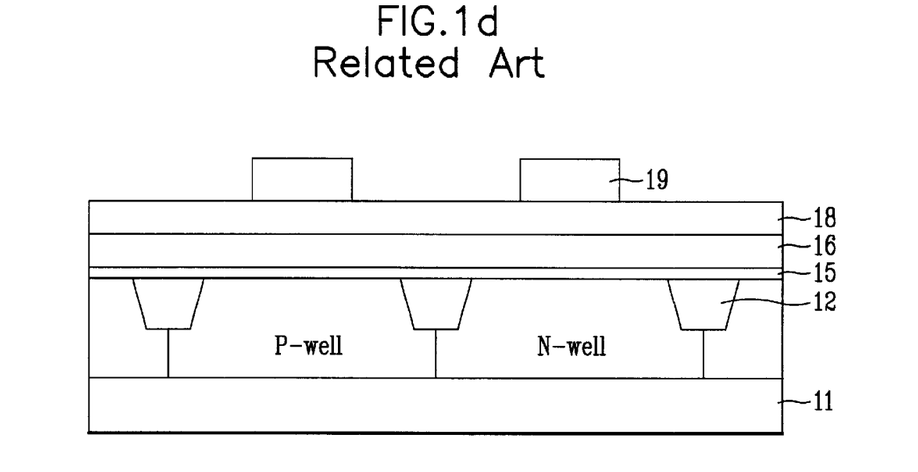

As shown in FIG. 1D, the second photoresist 17a is removed, and a tungsten silicide (WSi$_2$) or a tungsten (W) layer 18 is formed on the polysilicon layer 16. Subsequently, a third photoresist is deposited on the tungsten suicide layer 18. The third photoresist is patterned by exposure and developing processes to form a photoresist pattern 19. As shown in FIG. 1D, the photoresist pattern 19 is formed on the tungsten silicide layer 18.

Figure 1E:
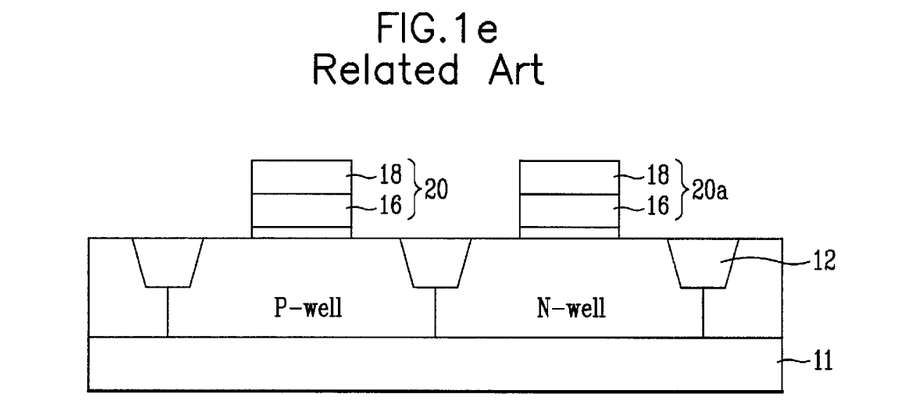

As shown in FIG. 1E, the tungsten silicide layer 18, the polysilicon layer 16, and the gate insulating film 15 are selectively removed by an etching process using the photoresist pattern 19 as a mask, to form a first gate electrode 20 and a second gate electrode 20a. The first gate electrode 20 is for an NMOS transistor and the second gate electrode 20a is for a PMOS transistor.

Figure 1F:
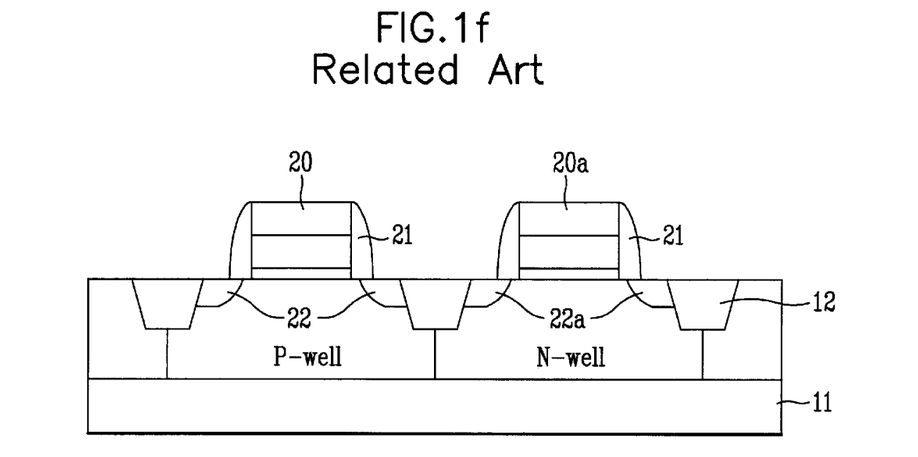

As shown in FIG. 1F, an oxide film or a nitride film is deposited on the entire surface of the semiconductor substrate including the gate electrodes 20 and 20a, and then etched back to form sidewall spacers 21 at both sides of the gate electrodes 20 and 20a.

Thereafter, the N well region 14 is masked, and then impurity ions are implanted into the P well region 13 at both sides of the first gate electrode 20 to form first source/drain impurity ion diffused regions 22.

Subsequently, the P well region 13 is masked, and then impurity ions are implanted into the N well region 14 at both sides of the second gate electrode 20a to form second source/drain impurity ion diffused regions 22a.

The second source/drain impurity ion diffused region 22a may also be formed Prior to the first source/drain impurity ion diffused region 22.

The related art method for forming a dual gate of a semiconductor device has several problems.

First, ion implantation is performed twice in order to dope impurity ions into the undoped polysilicon layer 16. Also, ion implantation is performed twice when forming source/drain impurity ion diffused regions 22, 22a corresponding to each of the transistors. This complicates process steps and increases the number of masks, thereby increasing cost.

Second, during ion implantation into the polysilicon layer 16, the impurity ions pass through the polysilicon layer 16 if the polysilicon layer 16 is thin. This damages the gate insulating film 15, thereby deteriorating its insulating characteristics.

Moreover, during boron ion implantation when forming a gate electrode for the PMOS transistor, the boron ions act to vary the threshold voltage of the device because its fast diffusion speed affects a channel region of the FET.

Third, since the tungsten silicide layer 18 formed on the polysilicon layer 16 has resistivity of about 100 $\mu\Omega$cm, it is impossible to reduce sheet resistance to 10 $\Omega$/sq or less, even though the polysilicon layer 16 is deposited to a thickness at 1000 Å or more.

Fourth, if a tungsten layer having resistivity lower than that of the tungsten silicide layer 18 is deposited on the polysilicon layer 16 to reduce resistance, titanium nitride (TiN) film or WN (tungsten nitride) film must additionally be formed to avoid reaction with silicon. This complicates process steps.

Fifth, a reoxidation process is required to restore damage caused to the gate insulating film 15 during the etching process for the formation of the gate electrode. However, selective reoxidation is required because the tungsten is likely to react with ambient O$_2$. Therefore, selective oxidation should exactly satisfy possible oxidation conditions, such as a ratio of H$_2$/O$_2$, and oxidation temperature. In this case, there is a problem in that redundancy of the selective oxidation is low.

Finally, if a cell region and a logic region are formed in a single chip, the logic region requires a salicide process so that the logic region has a gate electrode material different from that of the cell region.

SUMMARY OF THE INVENTION

Accordingly, the present invention is directed to a method for forming a dual gate of a semiconductor device that substantially obviates one or more of the problems due to limitations and disadvantages of the related art.

An object of the present invention is to provide a method for forming a dual gate of a semiconductor device, which improves reliability of the device and simplifies process steps by forming the same gate electrode material in both a cell region and a logic region.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in accordance with a first aspect of the present invention there is provided a method for forming a dual gate of a semiconductor device including the steps of sequentially stacking a gate insulating film, a semiconductor layer, and a low resistance metal layer on a semiconductor substrate having a first well of a first conductivity type and a second well of a second conductivity type, forming first and second gate patterns that include the semiconductor layer and the low resistance metal layer on the substrate corresponding to the first and second wells, forming sidewall spacers at sides of the first and second gate patterns, and exposing the first well and the first gate pattern, implanting impurity ions of the second conductivity type into the exposed first well and the first gate pattern to form a first source and a first drain, exposing the second well and the second gate pattern, implanting impurity ions of the first conductivity type into the exposed second well and the second gate pattern to form a second source and a second drain, and diffusing the impurity ions from the low resistance metal layer into the semiconductor layer to form first and second gate electrodes.

In another aspect of the present invention, there is provided a method for forming a dual gate of a semiconductor device, including the steps of selectively forming an isolation region on a semiconductor substrate, forming a P well region and an N well region in the semiconductor substrate, sequentially forming a gate insulating film, an undoped polysilicon layer, and a cobalt silicide layer on an entire surface of the semiconductor substrate, forming first and second gate patterns from the undoped polysilicon layer and the cobalt silicide layer on the substrate at the P well region and the N well region, respectively, forming sidewall spacers at sides of each of the first and second gate patterns and exposing the P well region including the first gate pattern, implanting N-type impurity ions into an upper portion of the first gate pattern and the P well region to form a first source and a first drain, exposing the N well region and the second gate pattern, implanting P-type impurity ions into an upper portion of the second gate pattern and the N well region to form a second source and a second drain, and doping the undoped polysilicon layer of the first and second gate patterns by diffusing the P-type and N-type impurity ions implanted into upper portions of the respective gate patterns to form first and second gate electrodes each including the cobalt silicide layer and the doped polysilicon layer, and at the same time forming source and drain impurity regions in the semiconductor substrate at both sides of the respective gate electrodes.

In another aspect of the present invention, in forming a gate electrode of embedded DRAM in which DRAM and a logic circuit are on a single chip, there is provided a method for forming a dual gate of a semiconductor device including the steps of dividing a semiconductor substrate into a DRAM region and a logic circuit region, and forming a P well region and an N well region in the DRAM region, sequentially forming a gate insulating film, an undoped polysilicon layer, and a low resistance metal layer on the semiconductor substrate, forming first and second gate patterns in the DRAM region and a third gate pattern in the logic circuit region by etching, forming sidewall spacers at sides of each of the first, second and third gate patterns, masking the N well region and second gate electrode pattern, implanting N-type impurity ions into a surface of the semiconductor substrate, exposing the N well region and second gate electrode pattern and then implanting P-type impurity ions into the surface of the semiconductor substrate, doping the undoped polysilicon layer of the first, second and third gate patterns by impurity ion diffusion, and at the same time forming source and drain impurity regions in the semiconductor substrate at sides of the gate patterns, and masking the DRAM region, and forming a second metal layer of the same material as the low resistance metal layer over the third gate pattern and on the substrate at sides of the third gate pattern.

In another aspect of the present invention, there is provided a method for forming a dual gate of a semiconductor device including the steps of forming a gate insulating film on a substrate having a first well of a first conductivity type and a second well of a second conductivity type, forming a semiconductor layer on the gate insulating film, forming a metal layer on the semiconductor layer, partially removing the gate insulating film, the semiconductor layer and the metal layer to form first and second gate patterns over the first and second wells, respectively, forming sidewall spacers at sides of the first and second gate patterns, exposing the first well and the first gate pattern, forming a first source and a first drain by implanting impurity ions of the second conductivity type into the exposed first well and the first gate pattern, exposing the second well and the second gate pattern, forming a second source and a second drain by implanting impurity ions of the first conductivity type into the exposed second well and the second gate pattern, and diffusing the impurity ions from the metal layer into the semiconductor layer to form first and second gate electrodes.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 2A:
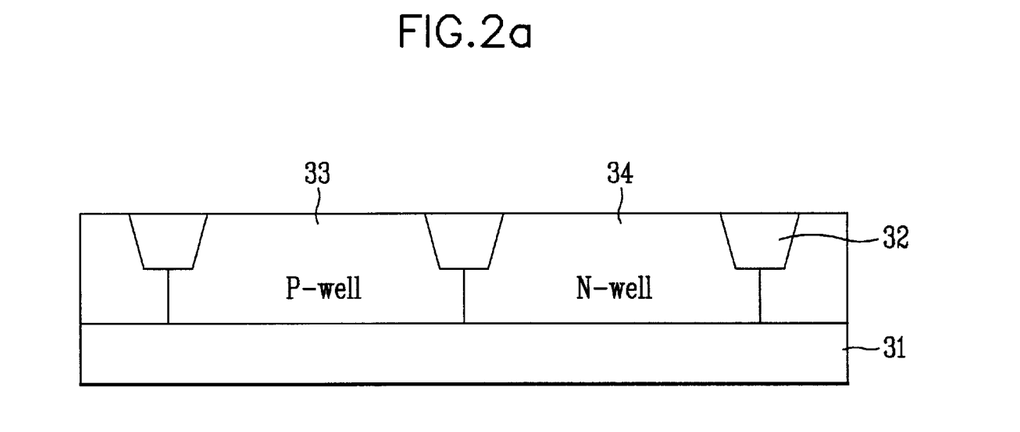
FIGS. 2A to 2F are cross-sectional views illustrating a method for forming a dual gate of a semiconductor device according to the present invention.

As shown in FIG. 2A, an isolation region 32 is selectively formed in a semiconductor substrate 31 by a LOCOS process or a trench isolation process. Thereafter, a P well region 33 and an N well region 34 are formed by impurity ion implantation using a mask (not shown) in the semiconductor substrate 31.

Figure 2B:
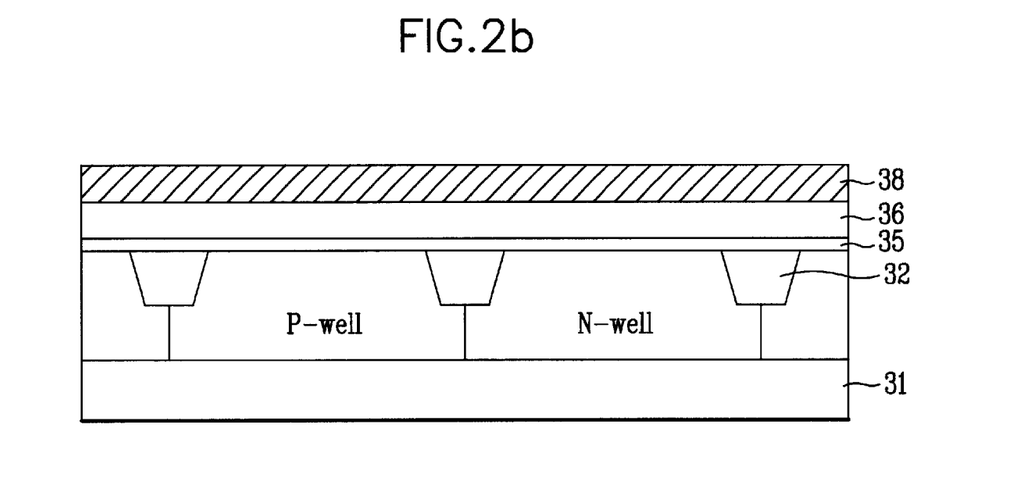

As shown in FIG. 2B, a gate insulating film 35 is formed on the semiconductor substrate 31 and the isolation regions 32. An undoped polysilicon layer 36 is deposited on the gate insulating film 35. Subsequently, a low resistance metal layer 38 that does not react with dopants such as As, B and P is formed on the polysilicon layer 36. Cobalt silicide ($CoSi_2$) may be used as the metal layer 38.

To form the metal layer 38, a silicide process is used, which includes the steps of depositing either $CoSi_2$ by sputtering process, or depositing Co by chemical vapor deposition (CVD), and annealing the deposited layer. The $CoSi_2$ acts to suppress a diffusion of boron ions during boron ions implantation for the formation of source/drain.

Figure 2C:
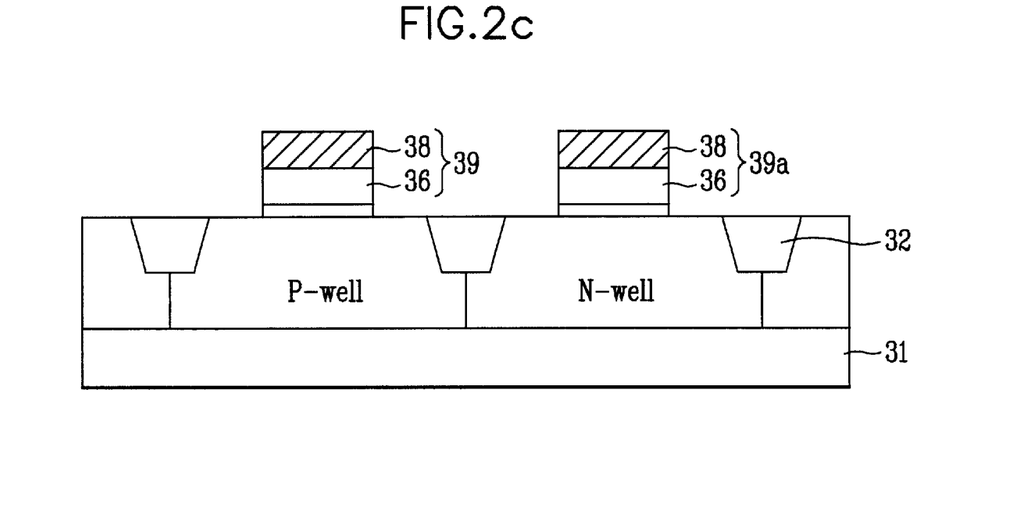

As shown in FIG. 2C, the metal layer 38, the polysilicon layer 36, and the gate insulating film 35 are selectively removed by photolithography process to form a first gate pattern 39 and a second gate pattern 39a. The first gate pattern 39 is used as a gate electrode of an NMOS transistor and the second gate pattern 39a is used as a gate electrode of a PMOS transistor.

Figure 2D:
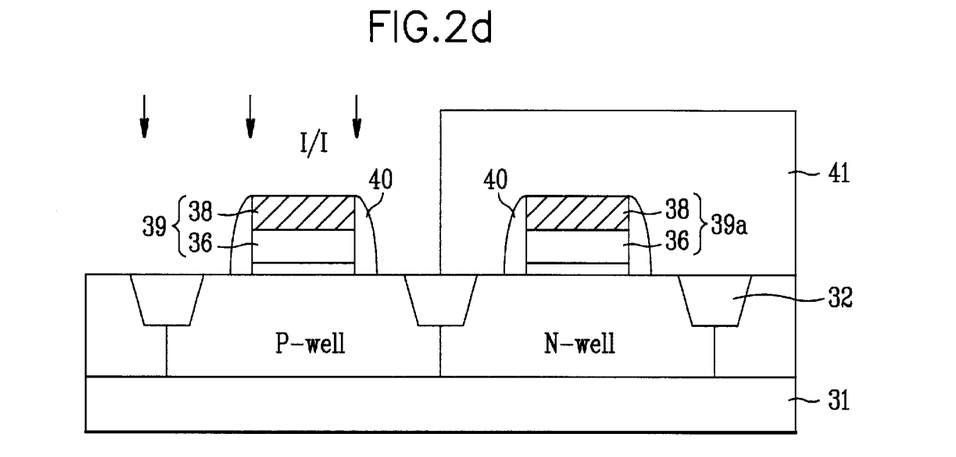

As shown in FIG. 2D, an oxide insulating film or a nitride film is deposited on the semiconductor substrate 31 including the gate patterns 39 and 39a. The oxide insulating film is etched back to form sidewall spacers 40 at both sides of the patterns 39 and 39a. Thereafter, impurity ion implantation for source/drain of the NMOS transistor and the source/drain of the PMOS transistor is performed. In other words, the N well region 34 is masked by a first photoresist 41 and then N-type impurity ions are implanted into the exposed P well region 33 to form source/drain region 43'. At this time, the impurity ions are implanted into the metal layer 38 of the first gate pattern 39.

Figure 2E:
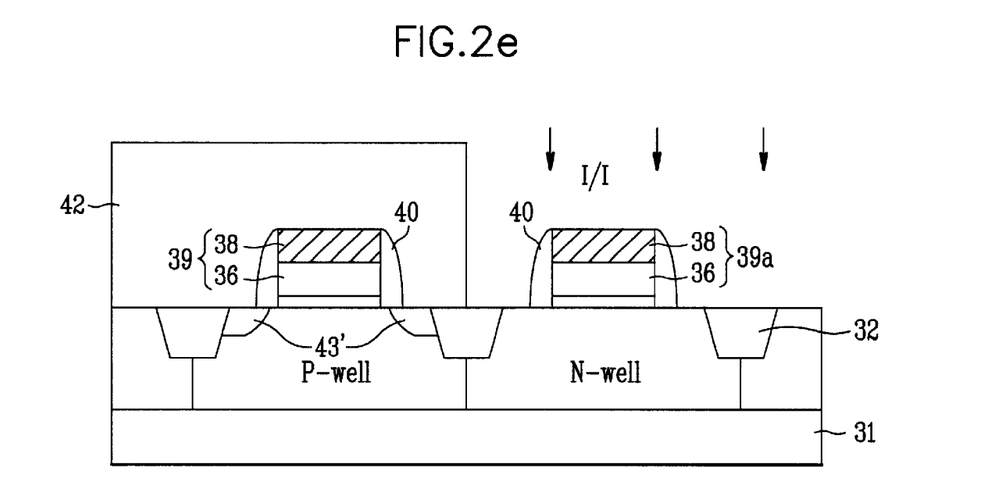

As shown in FIG. 2E, the first photoresist 41 masking the N well region 34 is removed, and then a second photoresist 42 is deposited and patterned to mask the P well region 33. P-type impurity ions, that is, boron (B) ions, are implanted into the exposed N well region 34. The P-type impurity ions are implanted into the metal layer 38 of the second gate pattern 39a.

The P-type impurity ion implantation may also be performed prior to the impurity ion implantation.

Figure 2F:
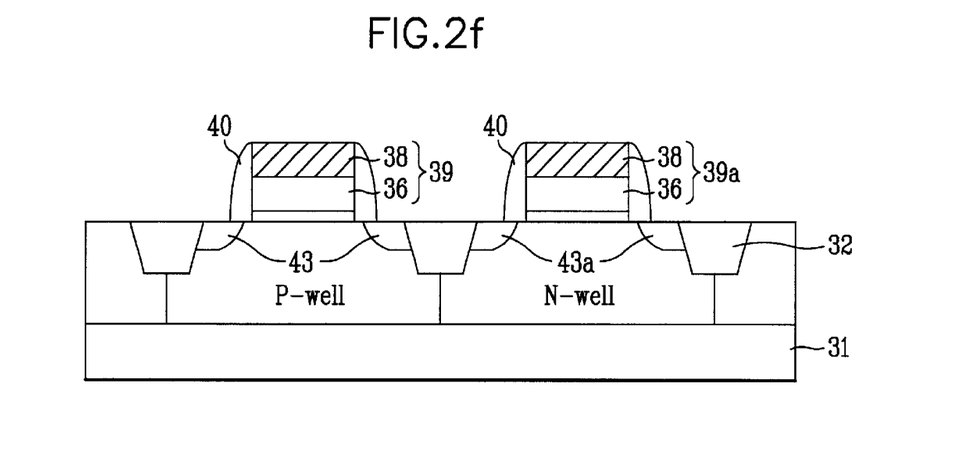

After the N-type impurity ion implantation and the P-type impurity ion implantation, the second photoresist 42 is removed, as shown in FIG. 2F.

Source/drain impurity ion diffused regions 43 of the NMOS transistor and source/drain impurity ion diffused regions 43a of the PMOS transistor are formed by annealing. The N-type impurity ions implanted into the metal layer 38 of the first gate pattern 39, and the P-type impurity ion implanted into the metal layer 38 of the second gate pattern 39a are diffused into the undoped polysilicon layer 36 below the metal layer 38. As a result, a Co-polycide gate with a dual gate structure is formed.

A gate electrode of a DRAM is fabricated by the above process steps. If the above process steps are used to form an embedded DRAM in which a DRAM and a logic circuit are in a single chip, the DRAM and the logic circuit can both have the same gate electrode material. Also, the process for forming the gate electrode can be performed at the same time in the DRAM region and the logic circuit region, so that the process can be simplified.

The process steps for forming the gate electrode in the DRAM region and the logic circuit region will be described in detail.

FIGS. 3A to 3F are cross-sectional views illustrating a method for forming a gate electrode of an embedded DRAM.

Figure 3A:
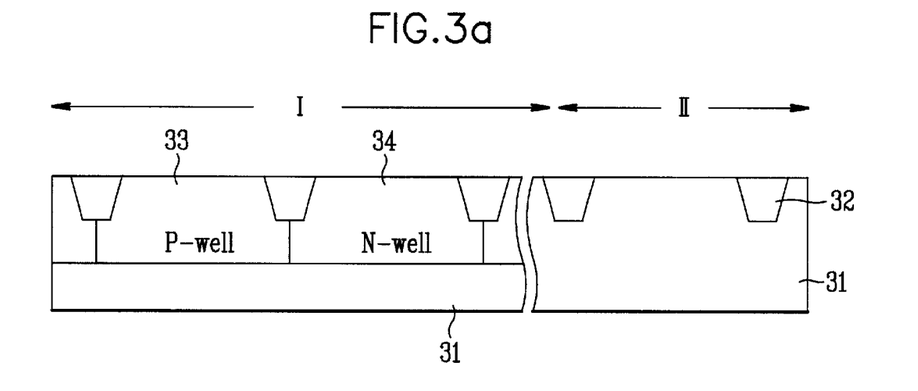
FIGS. 3A to 3F are cross-sectional views illustrating a method for forming a gate electrode in case where the present invention applies to an embedded DRAM.

As shown in FIG. 3A, a semiconductor substrate 31 of a first conductivity type has a DRAM region I and a logic circuit region II. An isolation region 32 is selectively formed in the semiconductor substrate 31 by a LOCOS process or a trench isolation process. Thereafter, a P well region 33 and an N well region 34 are formed by selectively implanting impurity ions into the semiconductor substrate 31 of the DRAM region I using a mask. The logic circuit region II is masked while the P well region 33 and the N well region 34 of the DRAM region I are being formed.

Figure 3B:
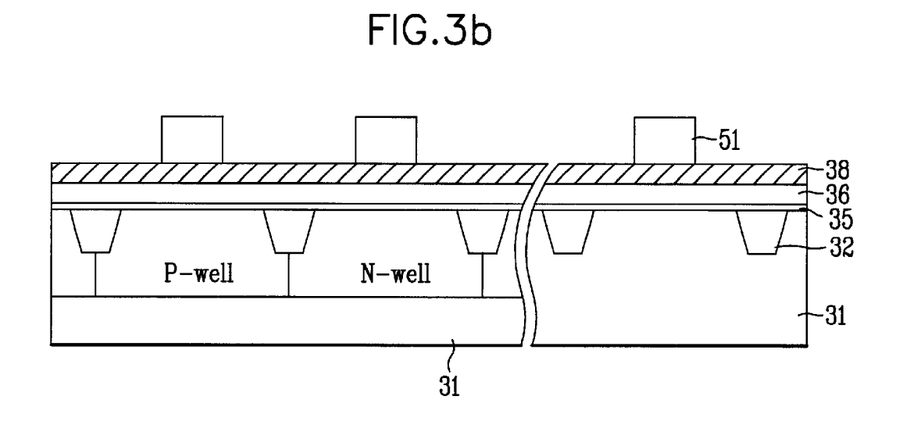

As shown in FIG. 3B, a gate insulating film 35 is formed on an entire surface of the semiconductor substrate 31 and the isolation region 32. An undoped polysilicon layer 36 is deposited on the gate insulating film 35. Subsequently, a low resistance metal layer 38 that does not react with dopants (such as As, B and P) is formed on the polysilicon layer 36. Cobalt silicide ($CoSi_2$) may also be used as the metal layer 38. The metal layer 38 acts to suppress diffusion of boron ions during boron ion implantation during the formation of a source and a drain of the DRAM region I.

Subsequently, a photoresist is deposited on the metal layer 38, and then a photoresist pattern 51 for patterning a gate electrode is formed by exposure and development process.

Figure 3C:
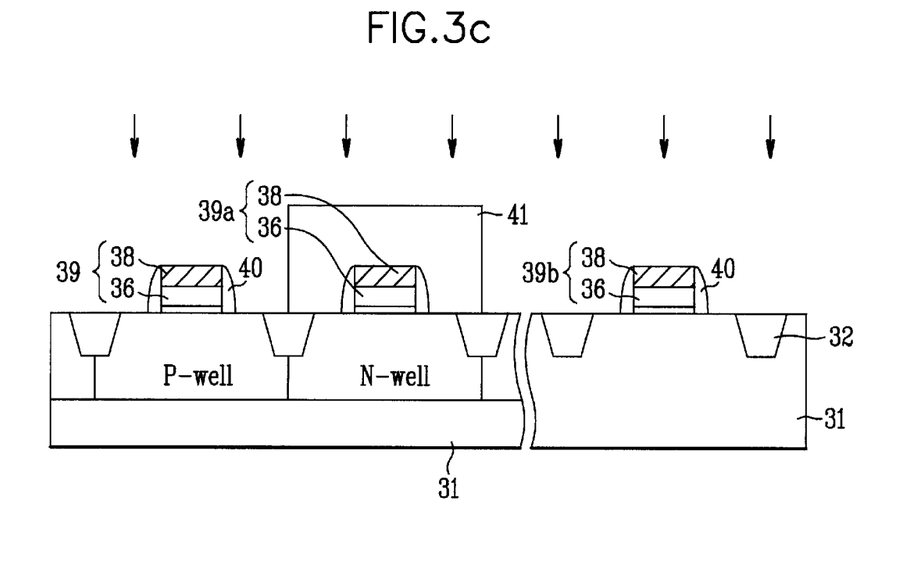

As shown in FIG. 3C, the metal layer 38, the polysilicon layer 36, and the gate insulating film 35 are selectively removed by an etching process using the photoresist pattern 51 as a mask, forming gate patterns 39, 39a and 39b in the DRAM region I and the logic circuit region II. For convenience, the gate patterns 39 and 39a of the DRAM region I are referred to first and second gate patterns and the gate pattern 39b of the logic circuit region II is referred to a third gate pattern.

As shown in FIG. 3C, the metal layer 38 of the logic circuit region II may be removed before forming the gate pattern, or may be left in place. This will not affect silicide process, which is generally required in the logic circuit region II. The first, second and third gate patterns 39, 39a and 39b are formed, and sidewall spacers 40 are formed at both sides of the respective gate patterns. The first gate pattern 39 is later used as a gate electrode of an NMOS transistor while the second gate pattern 39a is later used as a gate electrode of a PMOS transistor.

Figure 3D:
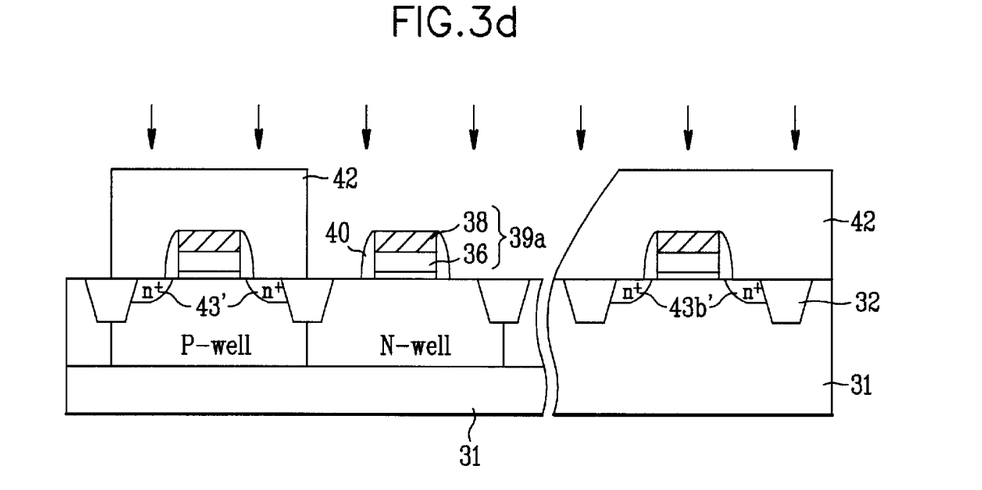

Subsequently, a first photoresist 41 is deposited on the entire surface of the semiconductor substrate 31 and then patterned to mask only the N well region 34, so that the N-type impurity ions are implanted into the exposed P well region 33 and the logic circuit region II. The N-type impurity ions (i.e., P or As ions) are also implanted into the metal layer 38 on the polysilicon layer 36. The N-type impurity ion implantation forms a source/drain region 43' of the NMOS transistor in the DRAM region I and a source/drain region 43b' in the logic circuit region II. As shown in FIG. 3D, the first photoresist 41 is removed, and then a second photoresist 42 is deposited on the entire surface of the substrate. The second photoresist 42 is patterned by exposure and developing processes to expose only the N well region 34. Thereafter, the P-type impurity ions, e.g., boron ions are implanted into the exposed N well region 34. At this time, the boron ions are also implanted into the metal layer 38 of the second gate pattern 39a.

Figure 3E:
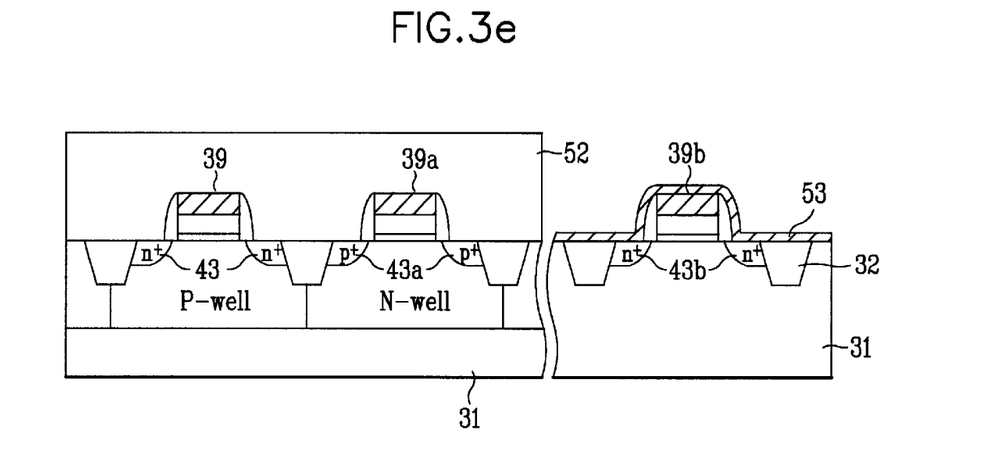

If annealing is performed after the impurity ion implantations, as shown in FIG. 3E, a source/drain impurity ion diffused region 43 for the NMOS transistor and a source/drain impurity ion diffused region 43a for the PMOS transistor are formed in the DRAM region I, while a source/drain impurity ion diffused region 43b is formed in the logic circuit region II.

Then, a silicide process is performed in the logic circuit region II. For the silicide process, as shown in FIG. 3E, the DRAM region I is masked using a mask 52 to expose only the logic circuit region II. A Cobalt (Co) layer 53, which is the same material as the low resistance metal layer 38, is deposited on the entire surface of the substrate 31 in the exposed logic circuit region II. A silicon nitride film, a silicon oxide film or a photoresist may be used as the mask 52.

Figure 3F:
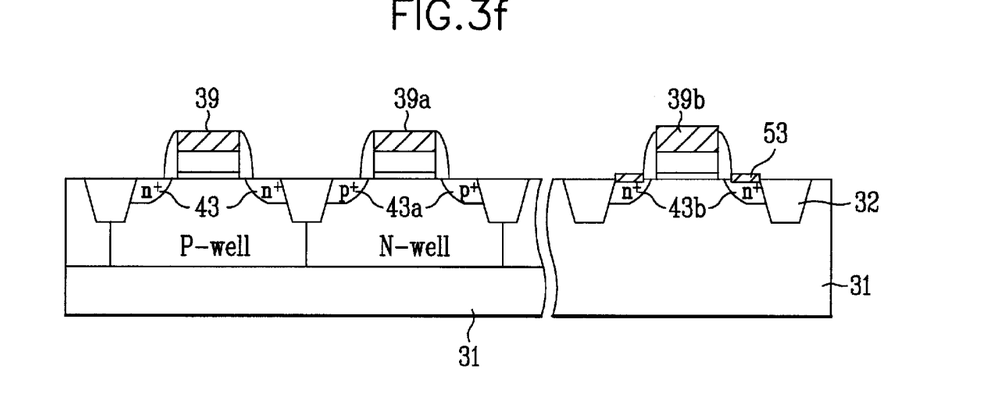

Subsequently, as shown in FIG. 3F, a cobalt silicide layer 53a is formed on the substrate 31 of the source/drain region 43b by annealing and washing.

The material for masking the DRAM region may be any one of a nitride film, an oxide film, a mixture film of a nitride film with an oxide film, and a photoresist film.

The method for forming a dual gate of a semiconductor device according to the present invention has the following advantages.

First, since ion implantations for the formation of the gate electrodes of the NMOS and PMOS transistors and ion implantations For the formation of the source/drain impurity ion diffused regions of the NMOS and PMOS transistors are performed at the same time, the process can be simplified and the number of masks can be reduced, reducing manufacturing cost.

Second, since the impurity ions are implanted into the cobalt silicide layer without directly being implanted into the polysilicon layer and then doped into the polysilicon through diffusion, the thickness of the polysilicon layer can be freely adjusted. Also, it is possible to prevent the gate insulating film from being damaged during ion implantation.

Third, it is possible to reduce resistivity by about 1/5 as compared with the tungsten silicide layer.

Fourth, since a separate diffusion prevention film for reducing resistance need not to be formed, the process steps can be simplified.

Fifth, in a reoxidation process for restoring damage caused to the gate insulating film during the etching step of the formation of the gate electrode, possible range of reoxidations is broad so that redundancy of the reoxidation process can be ensured.

Finally, in the embedded DRAM, the logic circuit region and the DRAM region can have the same gate electrode material. Also, the process for the formation of the respective gate electrodes can be performed at the same time, simplifying the process.

It will be apparent to those skilled in the art that various modifications and variations can be made in the method for forming a dual gate of a semiconductor device according to the present invention without departing from the spirit or scope of the invention. Thus, it is intended the present invention covers the modifications and variations of the invention provided they come within the scope of the appended claims and their equivalents.

What is claimed is:

1. In forming a gate electrode of embedded DRAM in which DRAM and a logic circuit are on a single chip, a method for forming a dual gate of a semiconductor device comprising the steps of:

dividing a semiconductor substrate into a DRAM region and a logic circuit region, and forming a P well region and an N well region in the DRAM region;

sequentially forming a gate insulating film, an undoped polysilicon layer, and a low resistance metal layer on the semiconductor substrate;

forming first and second gate patterns in the DRAM region and a third gate pattern in the logic circuit region by etching;

forming sidewall spacers at sides of each of the first, second and third gate patterns;

masking the N well region and second gate pattern, and implanting N-type impurity ions into a surface of the semiconductor substrate thereby doping the undoped polysilicon layer of the first and third gate patterns and forming a first source/drain region;

exposing the N well region and second gate pattern;

masking the P well region and the first and third gate patterns, and implanting P-type impurity ions into the surface of the semiconductor substrate thereby doping the undoped polysilicon layer of the second gate pattern and forcing a second source/drain region;

forming source and drain impurity regions in the semiconductor substrate at sides of the gate patterns by diffusing the impurity ions implanted into the first and second source/drain regions; and masking the DRAM region; and forming a second metal layer of the same material as the low resistance metal layer over the third gate pattern and on the substrate at both sides of the third gate pattern.

2. The method of claim 1, wherein the step of forming a second metal layer includes a salicide process.

3. The method of claim 1, wherein the low resistance metal layer includes cobalt silicide ($CoSi_2$).

4. The method of claim 3, wherein the low resistance metal layer is formed by a silicide process comprising the steps of:

depositing $CoSi_2$ by a sputtering process, and annealing; or said silicide process comprising the steps of:

depositing Co by CVD, and annealing.

5. The method of claim 1, wherein the P-type impurity ions are boron and the N-type impurity ions are P or As.

6. The method of claim 1, wherein the first gate pattern is a gate electrode of an NMOS transistor and the second gate pattern is a gate electrode of a PMOS transistor.

7. The method of claim 1, wherein a material for masking the DRAM region is one of a nitride film, an oxide film, a mixture film of a nitride film with an oxide film, and a photoresist film.

8. The method of claim 1, wherein the first, second and third gate patterns are formed after removing the low resistance metal layer in the logic circuit region.

* * * * *